United States Patent
Lee et al.

(10) Patent No.: US 8,093,916 B2
(45) Date of Patent: Jan. 10, 2012

(54) METHOD OF CHARACTERIZING A SEMICONDUCTOR DEVICE AND SEMICONDUCTOR DEVICE

(75) Inventors: Yue-Shiun Lee, Taipei (TW);
Yuan-Chang Liu, Miaoli (TW);
Cheng-Hsiung Chen, Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 413 days.

(21) Appl. No.: 12/478,776

(22) Filed: Jun. 5, 2009

(65) Prior Publication Data

US 2010/0315115 A1    Dec. 16, 2010

(51) Int. Cl.
*G01R 31/26* (2006.01)
*G01R 31/02* (2006.01)
*G21C 17/00* (2006.01)

(52) U.S. Cl. .................. 324/719; 324/762.01; 702/183; 257/61

(58) Field of Classification Search .................. 324/719, 324/762.01; 702/117, 182–183; 703/14; 257/61, 394–400
See application file for complete search history.

(56) References Cited

U.S. PATENT DOCUMENTS

| | | | |
|---|---|---|---|
| 5,451,886 A * | 9/1995 | Ogita et al. | 324/754.23 |
| 6,141,632 A | 10/2000 | Smith, III et al. | |
| 6,173,235 B1 * | 1/2001 | Maeda | 702/58 |
| 6,442,735 B1 | 8/2002 | Joshi et al. | |
| 6,490,546 B1 | 12/2002 | Kimmel et al. | |
| 6,514,809 B1 * | 2/2003 | Xiang | 438/214 |
| 6,567,773 B1 | 5/2003 | Rahmat et al. | |
| 6,822,260 B1 * | 11/2004 | Nariman et al. | 257/48 |
| 7,127,384 B2 | 10/2006 | Zolotov et al. | |
| 2003/0220779 A1 | 11/2003 | Chen et al. | |
| 2004/0054514 A1 | 3/2004 | Flatresse et al. | |
| 2005/0055191 A1 | 3/2005 | Hogyoku | |

* cited by examiner

*Primary Examiner* — Huy Q Phan
*Assistant Examiner* — Joshua Benitez
(74) *Attorney, Agent, or Firm* — Winston Hsu; Scott Margo (57) ABSTRACT

A method of characterizing semiconductor device includes providing a silicon-on-insulator (SOI) substrate with at least a body-tied (BT) SOI device and a BT dummy device for measurement, respectively measuring tunneling currents ($I_{gb}$) and scattering parameters (S-parameters) of the BT SOI device and the BT dummy device, subtracting $I_{gb}$ of BT dummy device from that of the BT SOI device to obtain $I_{gb}$ of a floating body (FB) SOI device, filtering characteristics of the BT dummy device out to extract S-parameters of the FB SOI device, and analyzing the S-parameters of the FB SOI device to obtain gate-related capacitances of the FB SOI device.

20 Claims, 8 Drawing Sheets

METHOD OF CHARACTERIZING A SEMICONDUCTOR DEVICE AND SEMICONDUCTOR DEVICE

BACKGROUND OF THE INVENTION

1. Field of the Invention

The present invention relates to a method of characterizing a semiconductor device and a semiconductor device, and more particularly, to a method of characterizing a floating body silicon-on-insulator (FB SOI) semiconductor device and a semiconductor device used in said method.

2. Description of the Prior Art

With demands for high performance applications, silicon-on-insulator (SOI) technology is developed to provide advantages over conventional bulk metal-oxide-semiconductor field-effect transistor (MOSFET) device that is not able to suppress ultra-short channel effect, and undesired parasitic capacitance and leakage current due to unavoidably PN junctions existed in the bulk silicon MOSFET device.

In SOI technology, the MOSFET device is built on a silicon layer which is separated from a substrate by a buried oxide (BOX) layer. The SOI MOSFET device possesses smaller parasitic capacitance that resulting in superior speed characteristics in circuit operation. The SOI MOSFET device is more radiation-resistant; therefore soft-error immunity is improved. Due to the BOX layer sandwiched between the silicon layer and the substrate, latch-up effect is prevented. Furthermore, since the SOI MOSFET device is not that susceptible to the short channel effect, it is more easily to be scaled down. Based on the benefits of high performance, high packaging density and low power consumption, the SOI MOSFET device is taken as next mainstream device in the future.

According to the thickness of the silicon layer formed on the BOX layer, SOI technology is divided into the partially depleted (PD) SOI and the fully depleted (FD) SOI. And the PD SOI technology is predominant due to higher productivity in the state-of-the-art. Please refer to FIG. 1, which is a schematic diagram of a conventional PD SOI device. The PD SOI device 100 is positioned on a SOI substrate 110, the SOI substrate 110 comprises a substrate 112, a silicon layer 116 and a BOX layer 114 sandwiched between the substrate 112 and the silicon layer 116. The PD SOI device 100 comprises a gate conductive layer 120, a gate dielectric layer 122, and a source/drain 124. The silicon layer 116 of the PD SOI device is thicker than the depletion region, therefore a portion of the SOI substrate 110 is not depleted. Accordingly, a body 126 of the PD SOI device 100 is a floating body. Furthermore, the body 126 of the PD SOI device 100 is not grounded, therefore carriers generated by impact ionization are accumulated. Accordingly, the body potential of the PD SOI device 100 floats in different operation conditions such as in static, dynamic, or transient state, which leads to change of the threshold voltage of the PD SOI device 100, so-called hysteresis effect or history effect. Briefly speaking, the body potential and the characteristics of the PD SOI device 100 are susceptible to the history effect.

Figure 1:
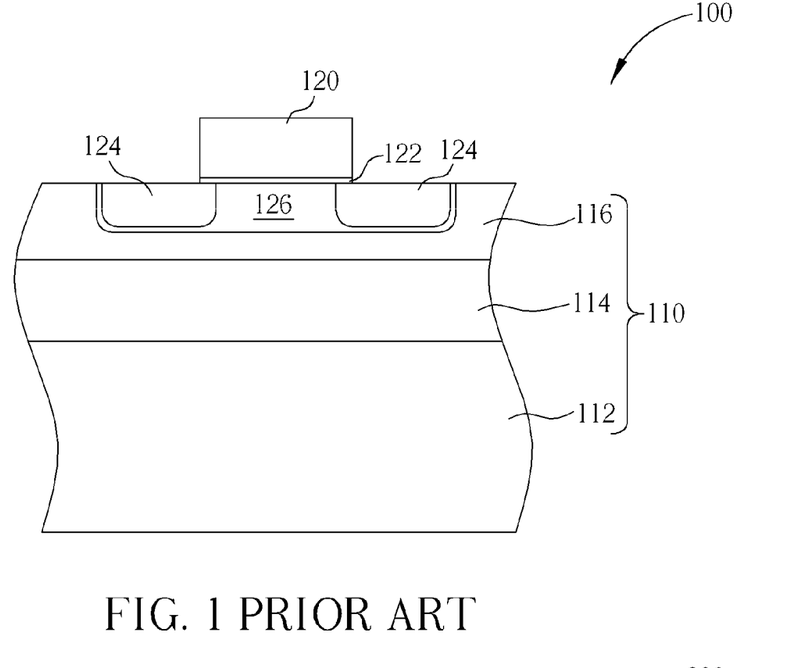
FIG. 1 is a schematic diagram of a conventional PD SOI device.

As mentioned, since the body 126 of the PD SOI device 100 is not grounded and the characteristics of the PD SOI device 100 is susceptible to the history effect, real characteristics such as the gate-to-body capacitance ($C_{gb}$) and the tunneling current ($I_{gb}$) of the PD SOI device 100, specifically of the floating body (FB) SOI device, are not able to be characterized in the state-of-the-art.

In addition, it is well-known that the input impedance of the radio frequency (RF) MOSFET devices is given by the gate impedance and the gate capacitance, therefore accurate results of measurement of the gate capacitance are critical to RF circuit simulation. It is also well-known that characteristics analysis is very important: a reliable device model is built on the accurate measurement from which real characteristics of the device are able to be extracted. Accordingly, the device characteristics obtained from said results of measurement are the basis of improvement for the device and process designers.

SUMMARY OF THE INVENTION

It is therefore a primary objective of the present invention to provide a method of characterizing a semiconductor device and a semiconductor device used in said method that is able to obtain the accurate characteristics of the FB SOI device.

According to the claimed invention, a method of characterizing a semiconductor device is provided. The method includes steps of providing a silicon-on-insulator (SOI) substrate with at least a body-tied (BT) SOI device and a body-tied (BT) dummy device for measurement, wherein the BT dummy device comprises a first conductive type source/drain heavily doped region and a dummy gate, and the dummy is not positioned on the first conductive type source/drain heavily doped region; respectively measuring scattering parameters (S-parameters) and tunneling currents ($I_{gb}$) of the BT SOI device and the BT dummy device; subtracting $I_{gb}$ of the BT dummy device from that of the BT SOI device to obtain $I_{gb}$ of a floating body (FB) SOI device; filtering characteristics of the BT dummy device out to extract a S-parameter of the FB SOI device; and analyzing the S-parameter of the FB SOI device for obtaining a capacitance ($C_{gb}$) of the FB SOI device.

According to the claimed invention, a semiconductor device is further provided. The semiconductor device comprises a SOI substrate having a second conductive type well, a first conductive type source/drain heavily doped region formed in the second conductive type well, a second conductive type heavily doped region formed in the SOI substrate, the second conductive type heavily doped region being isolated from the first conductive type source/drain heavily doped region by the second conductive type well, a dummy gate positioned on the second conductive type well, the dummy gate being not across the first conductive type source/drain heavily doped region and a body-tied (BT) body electrically connected to a circuit.

According to the method of characterizing a semiconductor device provided by the present invention, the dummy device is positioned in company with the de-embedding technology introduced for the first time to filter the parasitic effect of the BT SOI device out. Therefore accurate $C_{gb}$ of the FB SOI device can be obtained by analyzing the S-parameter. Furthermore, the $I_{gb}$ of the dummy device is provided to calibrate the $I_{gb}$ of the BT SOI device, thus a real $I_{gb}$ of the FB SOI device is obtained.

These and other objectives of the present invention will no doubt become obvious to those of ordinary skill in the art after reading the following detailed description of the preferred embodiment that is illustrated in the various figures and drawings.

DETAILED DESCRIPTION

The method of measuring a semiconductor device and a semiconductor device used in said method is preferably constructed in a RF test key in the scribe line between two dies of a device wafer or on the surface of a monitor wafer. That is, as the semiconductor processes for fabricating the RF devices are performed, the semiconductor device is simultaneously formed by the same processes for simulation. Then, parameters of the processes, from which real device characteristics are extracted, are measured by testing the test keys with metal probe.

Figure 2:
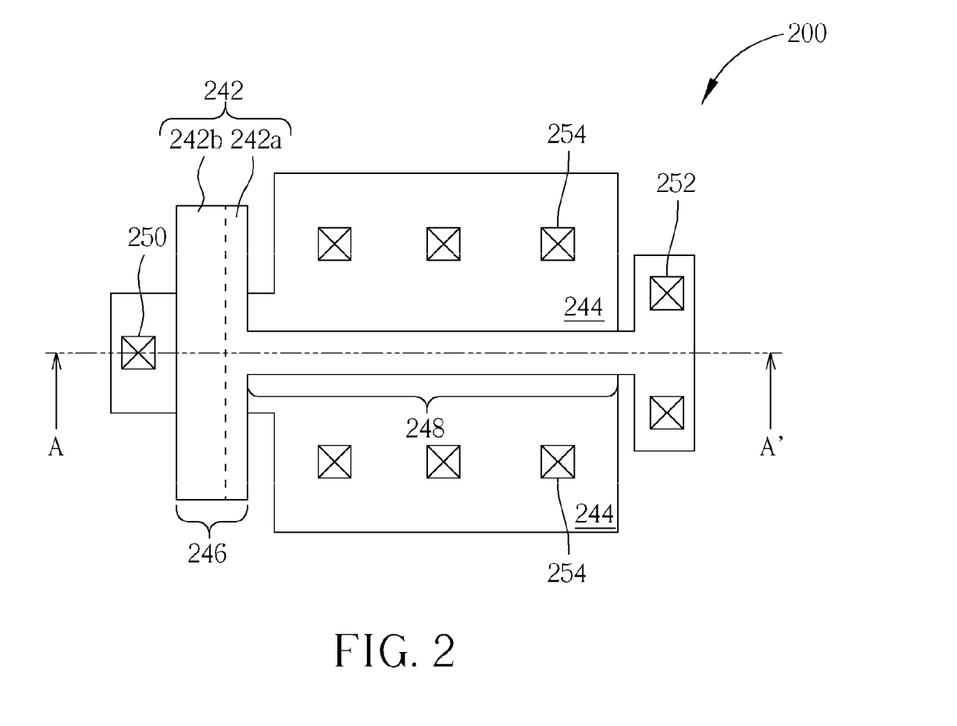
FIG. 2 is a schematic diagram of a BT SOI device provided by a first preferred embodiment.
Figure 3:
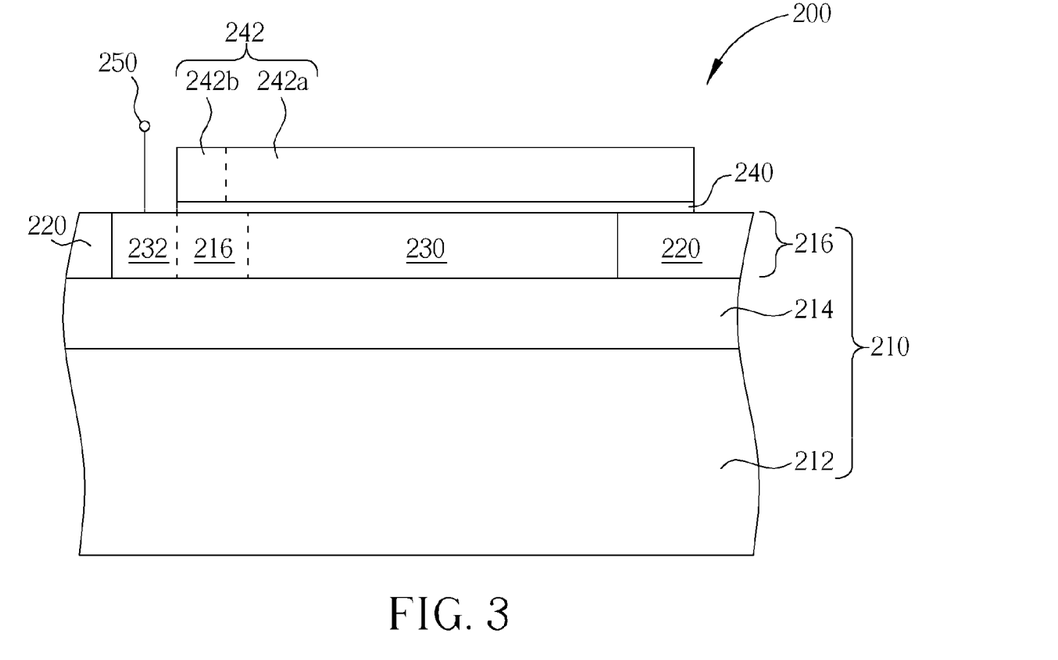
FIG. 3 is a cross-sectional view of the BT SOI device of FIG. 2 taken along line A-A'.

Please refer to FIG. 2 and FIG. 3, FIG. 2 is a schematic diagram of a body-tied SOI (hereinafter abbreviated to BT SOI) device provided by a first preferred embodiment; FIG. 3 is a cross-sectional view of the BT SOI device of FIG. 2 taken along line A-A'. As mentioned above, the BT SOI device is formed in the scribe line of a device wafer or on the surface of a monitor wafer by processes performed to fabricate the RF devices, therefore those details are omitted herein in the interest of brevity. Furthermore, although the BT SOI device provided by the first preferred embodiment is an N-type MOSFET device, those skilled in the art would easily realize that the BT SOI device is not limited to be a P-type BT SOI device. When the BT SOI device is provided as a P-type BT SOI device, it is well-known that the adoptions of N- or P-type dopants are to be contrary to the following description.

As shown in FIG. 2 and FIG. 3, the first preferred embodiment provides a BT SOI device 200 positioned on a SOI substrate 210. The SOI substrate 210 comprises a substrate 212, a buried oxide (BOX) layer 214 and a P-type doped silicon layer 216. Due to the high integrity to silicon wafer process and superior insulation of silicon oxide (SiO), BOX layer 214 is preferred to be oxide layer, but it is not limited to this. In the P-type doped silicon layer 216, a shallow trench isolation (STI) 220 and a P-well 230 are provided. A portion of the P-well 230 serves as a body of the BT SOI device 200.

The BT SOI device 200 includes a gate dielectric layer 240 (shown in FIG. 3) formed on the substrate 210 and a T-shaped gate structure 242 formed on the gate dielectric layer 240. The gate dielectric layer 240 comprises SiO, SiN, or high-K dielectric material. The gate structure 242 includes a first part 246, which is taken as the head of the T-shaped gate structure 242, and a second part 248 perpendicular to the first part 246. As shown in FIG. 2, the second part 248 is formed across the P-well 230. At two sides of the second part 248, an N-type source/drain heavily doped region 244 is formed in the P-well 230. It is noteworthy that in the ion implantation performed to form the N-type source/drain heavily doped region 244, the second part 248 and a portion of the first part 246 over the P-well 230 serve as an ion implant mask, therefore said second part 248 and first part 246 are to have N-type dopants, and thus an N-type region 242a as shown in FIGS. 2 and 3 is obtained. Furthermore, a portion of the first part 246 that is distal to the N-type source/drain heavily doped region 244 serves as another ion implant mask in a P-type ion implantation, therefore said portion of the first part 246 is to have P-type dopants, and thus a P-type region 242b is obtained as shown in FIG. 2 and FIG. 3. The gate structure 242 is divided into a first part 246 and a second part 248 that is perpendicular to the first part 246 and crosses the P-well 230 according to its structural feature; the gate structure 242 is also divided into the N-type region 242a and the P-type region 242b according to dopant types. In addition, the P-type ion implantation mentioned above is performed to form a P-type heavily doped region 232 in the P-type doped silicon layer 216. The BT SOI device 200 further comprises contact plugs 250, 252 and 254 (shown in FIG. 2). The contact plug 250 is electrically connected to the body under the gate structure 242, the contact plug 252 is electrically connected to the gate structure 242, and the contact plugs 254 are electrically connected to the N-type source/drain heavily doped region 244. Accordingly, device characteristics of the BT SOI device 200, such as the $C_{gb}$ and $I_{gb}$ are measured and extracted.

However, the first part 246 of the T-shaped gate structure 242 comprises the N-type region 242a and the P-type region 242b, therefore the obtained $C_{gb}$ and $I_{gb}$ of the second part 248, which has practical function, are distorted. In other words, though the device characteristics of the BT SOI device 200 are obtained, the real device characteristics is not actually obtained because a substantial parasitic effect is generated by the first part 246, which includes the N-type region 242a and the P-type region 242b, of the T-shaped gate structure 242.

Figure 4:
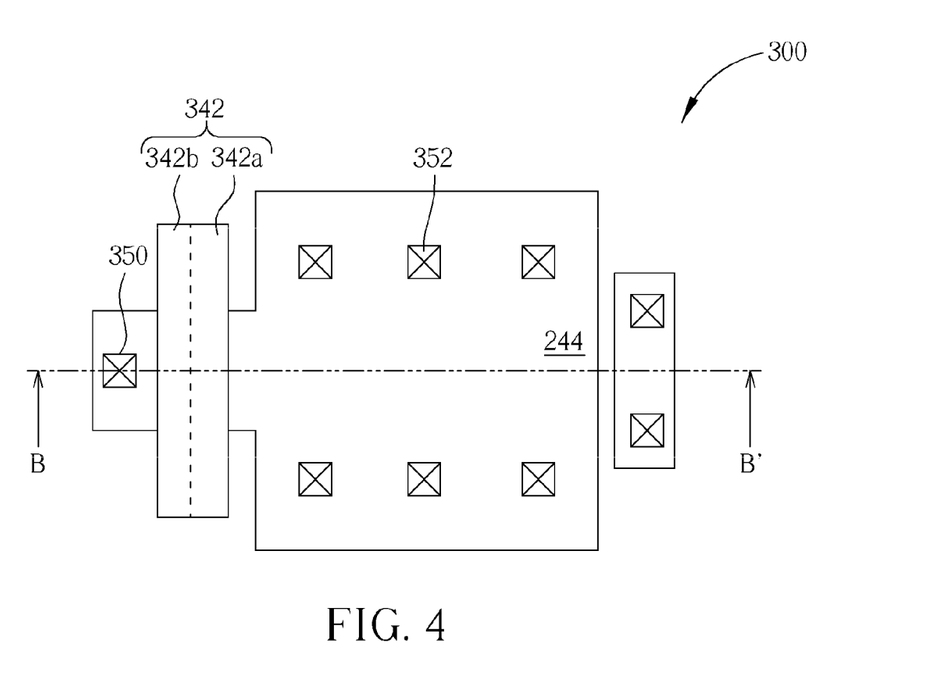
FIG. 4 is a schematic diagram of a BT dummy device provided by the first preferred embodiment.
Figure 5:
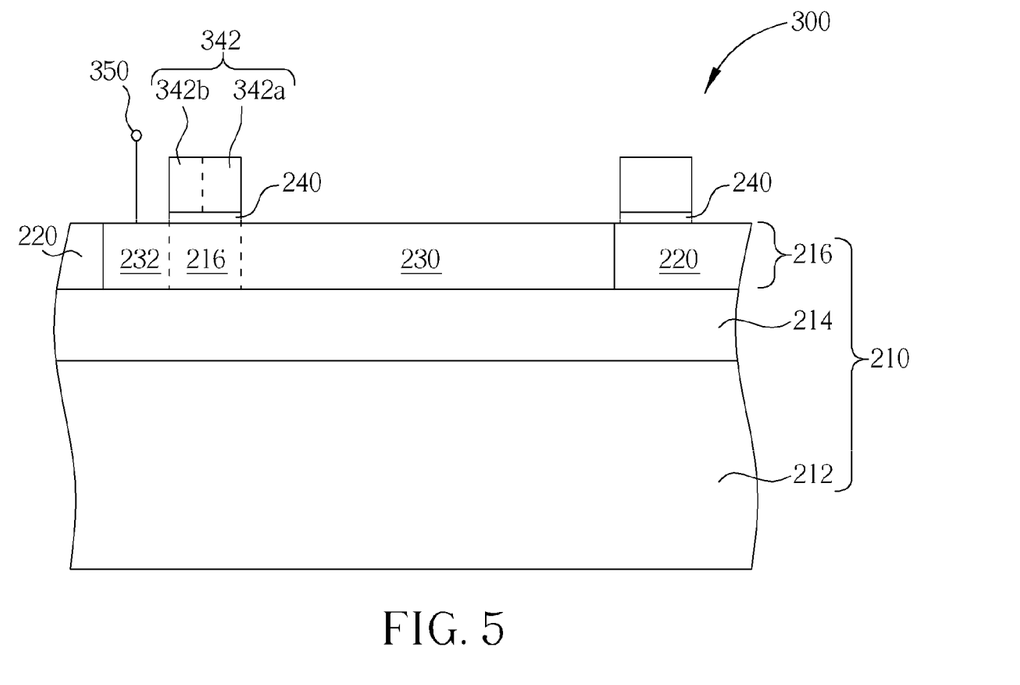
FIG. 5 is a cross-sectional view of the BT dummy device of FIG. 4 taken along line B-B'.

Please refer to FIG. 4 and FIG. 5, FIG. 4 is a schematic diagram of a BT dummy device 300 provided by the first preferred embodiment, and FIG. 5 is a cross-sectional view of the BT dummy device 300 of FIG. 4 taken along line B-B'. As mentioned above, the BT dummy device 300 provided by the first preferred embodiment is formed by the processes performed to fabricate the RF devices and the BT SOI device 200, therefore those details are omitted for brevity.

As shown in FIG. 4, the BT dummy device 300 is formed on the SOI substrate 210 as the BT SOI device 200. The BT dummy device 300 comprises a dummy gate 342. What different from the BT SOI device 200 is that the BT dummy device 300 does not include the second part 248 that across the P-well 230 and possesses the practical function, which means the layouts of the dummy gate 342 and the T-shaped gate structure 242 are different. However, the BT dummy device 300 still has the same implantation pattern as the BT SOI device 200 and undergoes the same ion implantation that used to form the N-type source/drain heavily doped region 244. Consequently, the dopants are to enter the P-well 230 and the dummy gate 342, thus an N-type source/drain heavily doped region 244 and an N-type region 342a are obtained as shown in FIG. 5. Similarly, the BT dummy device 300 also undergoes the P-type ion implantation, thus a P-type region 342b is formed and a P-type heavily doped region 232 is formed in the P-type doped silicon layer 216. The P-type heavily doped region 232 is isolated from the N-type source/drain heavily doped region 244 by the P-well 230. Accordingly, the dummy gate 342 of the BT dummy device 300 is identical to the first part 246 of the gate structure 242 of the BT SOI device 200. However, the dummy gate 342 of the BT dummy device 300 is not across the N-type source/drain heavily doped region 244. The BT dummy device 300 also comprises contact plugs 350 and 352: the contact plug 350 is electrically connected to the body, and the contact plug 352 is electrical connected to the N-type source/drain heavily doped region 244. Therefore BT dummy device 300 is able to provide characteristics of the dummy gate 342 to the body.

Figure 6:
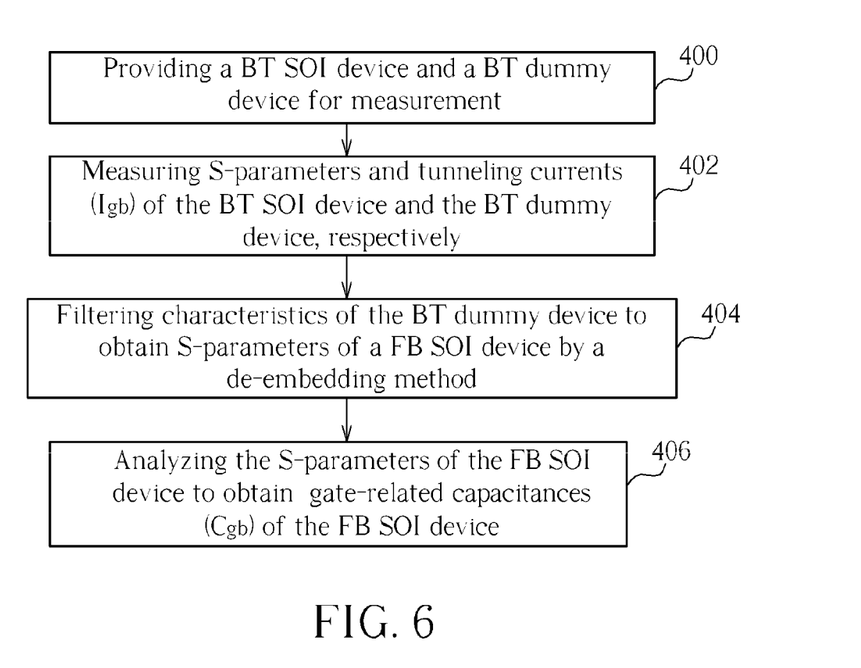
FIG. 6 is a flowchart illustrating a method of measuring a semiconductor device provided by the first preferred embodiment.

Please refer to FIG. 6, which is a flowchart illustrating a method of measuring a semiconductor device provided by the first preferred embodiment. As shown in FIG. 6, the provided method comprises steps of:

400: providing a BT SOI device 200 and a BT dummy device 300 for measurement;
402: measuring scattering parameters (S-parameters) and tunneling currents ($I_{gb}$) of the BT SOI device and the BT dummy device, respectively;
404: filtering characteristics of the BT dummy device out to obtain S-parameters of a floating body (FB) SOI device by a de-embedding method; and
406: analyzing the S-parameter of the FB SOI device to obtain gate-related capacitances ($C_{gb}$) of the FB SOI device.

According to the method provided by the present application, the dummy gate 342 of the BT dummy device 300 is identical to the first part 246 of the T-shaped gate structure 242 of the BT SOI device 200, which distorts the results of measurement. Therefore gate-to-body characteristics provided by the dummy gate 342 of the BT dummy device 300 is identical to said first part 246. According to the present invention, the de-embedding method is introduced with proper software to filter the parasitic component of the under-test device out. That is to filter out the parasitic effect generated by the first part 246 of the T-shaped gate structure 242 of the BT SOI device 200 and extract a S-parameter of the FB SOI device by the BT dummy device 300. Due to successful removal of the parasitic effect, the real $C_{gb}$ of the FB SOI device is obtained by transforming the S-parameter to admittance parameter (Y-parameter) or impedance parameter (Z-parameter). Furthermore, by the $I_{gb}$ provided by the BT dummy device 300, the $I_{gb}$ of the BT SOI device 200 is calibrated, and a real $I_{gb}$ of the FB SOI device is obtained.

Figure 7:
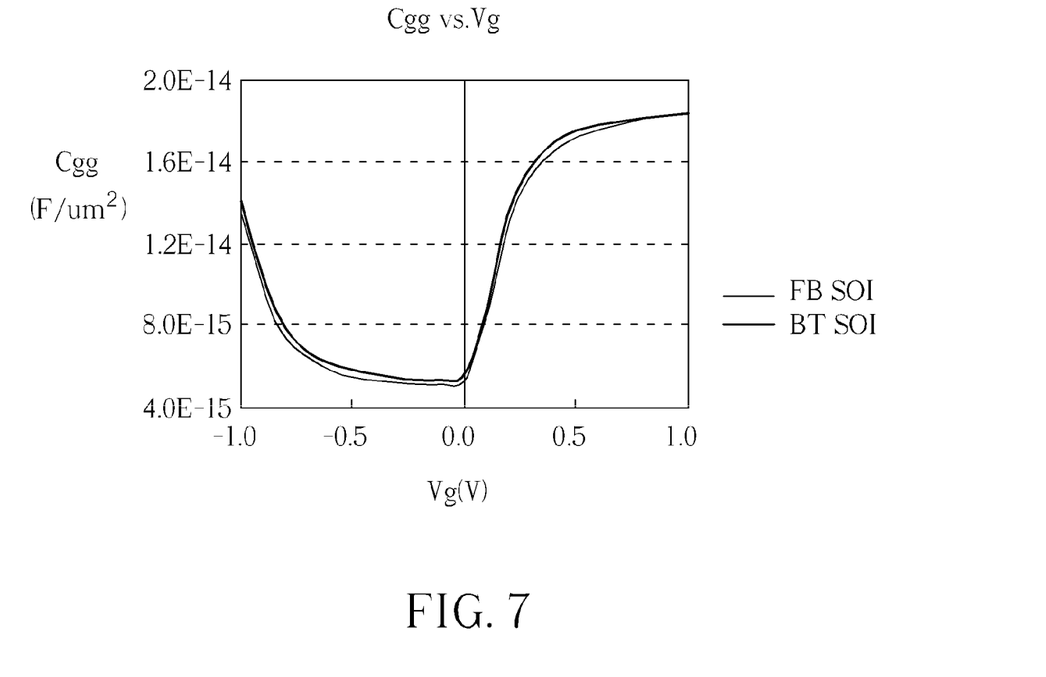
FIG. 7 is a schematic diagram for comparing the $C_{gb}$ of an N-type BT SOI device with the $C_{gb}$ of an N-type FB SOI device obtained by the present invention
Figure 8:
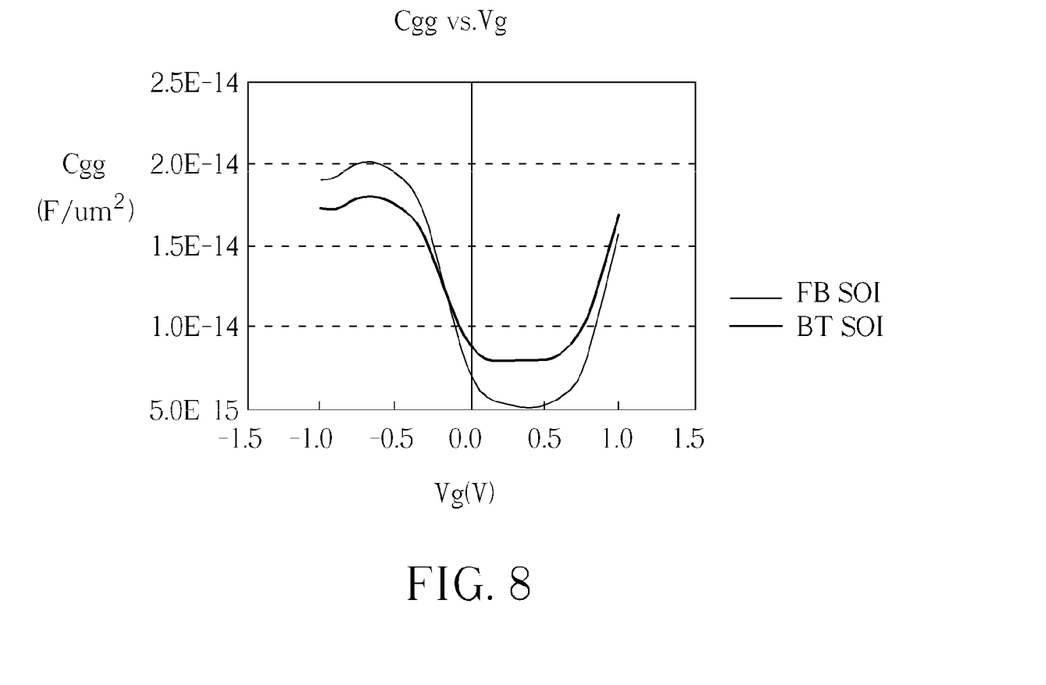
FIG. 8 is a schematic diagram for comparing the $C_{gb}$ of a P-type BT SOI device with the $C_{gb}$ of a P-type FB SOI device obtained by the present invention.
Figure 9:
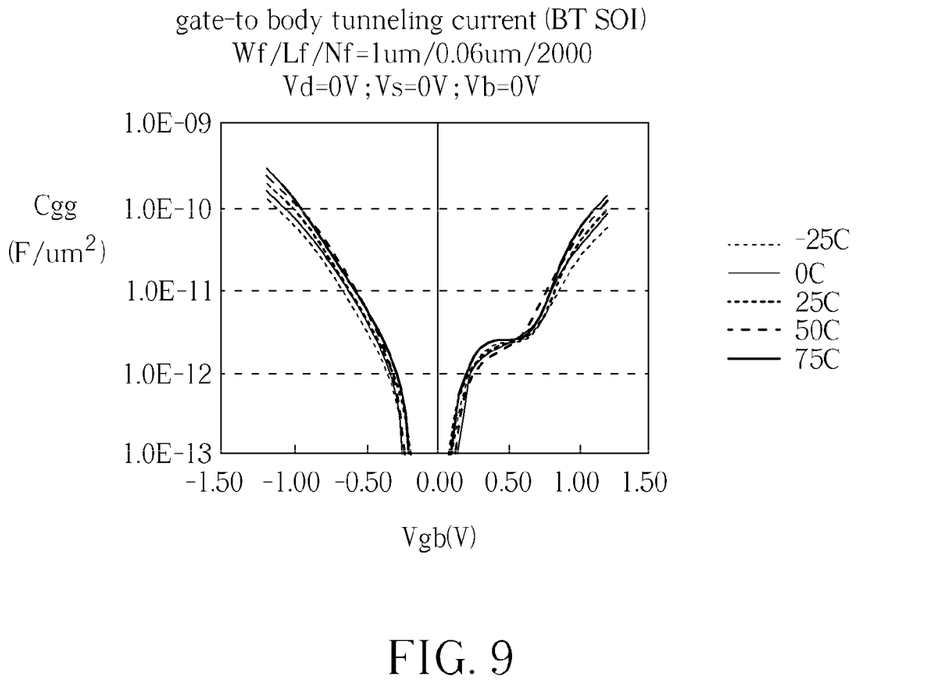
FIG. 9 is a tunneling current-to-gate voltage ($I_{gb}$-$V_{gb}$) curve diagram of an N-type BT SOI device.

Please refer to FIG. 7 and FIG. 8, FIG. 7 is a schematic diagram for comparing the $C_{gb}$ of an N-type BT SOI device with the $C_{gb}$ of an N-type FB SOI device obtained by the present invention, and FIG. 8 is a schematic diagram for comparing the $C_{gb}$ of a P-type BT SOI device with the $C_{gb}$ of a P-type FB SOI device obtained by the present invention. As shown in FIG. 7, compared with the real $C_{gb}$ of the N-type FB SOI device, the $C_{gb}$ of the N-type BT SOI device is overestimated because the head of the T-shaped gate structure as the first part 246 in the first preferred embodiment. As shown in FIG. 8, compared with the real $C_{gb}$ of the P-type FB SOI device, the $C_{gb}$ of the P-type BT SOI device is under-estimated. Therefore, it is found the parasitic component of the under-test device is successfully filtered out by the method provided by the present invention, and thus real characteristics are obtained.

Figure 10:
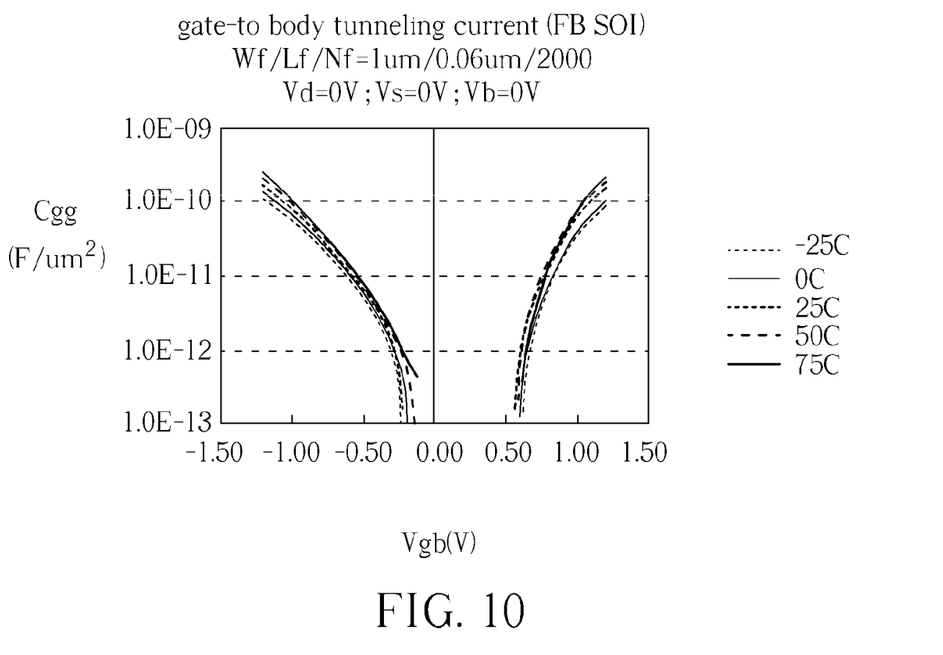
FIG. 10 is an $I_{gb}$-$V_{gb}$ curve diagram of an N-type FB SOI device obtained by the present invention.
Figure 11:
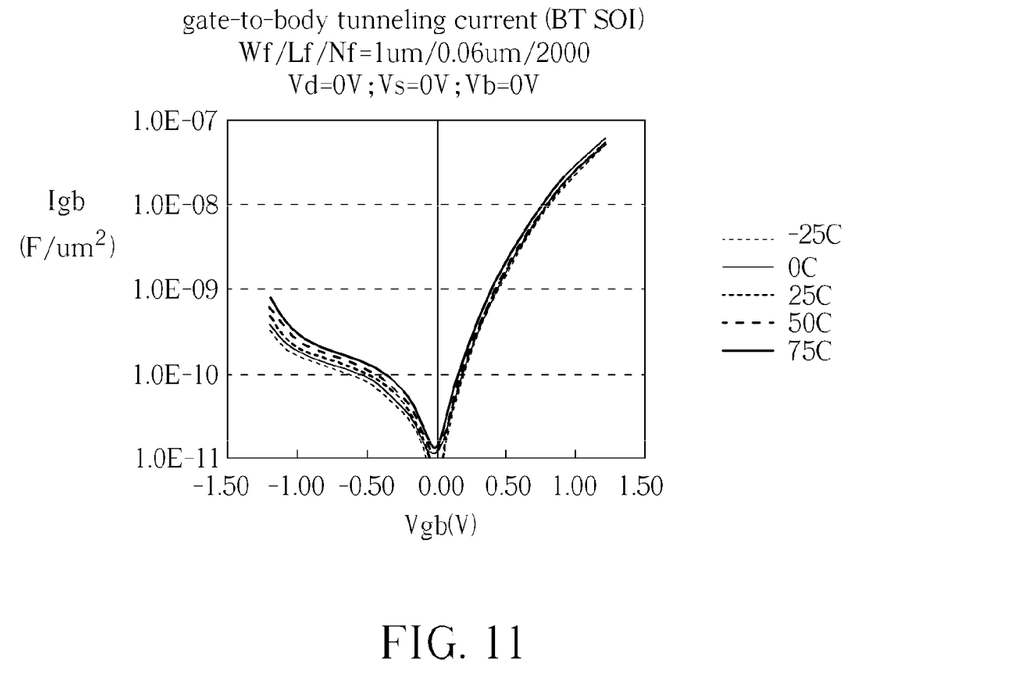
FIG. 11 is an $I_{gb}$-$V_{gb}$ curve diagram of a P-type BT SOI device.
Figure 12:
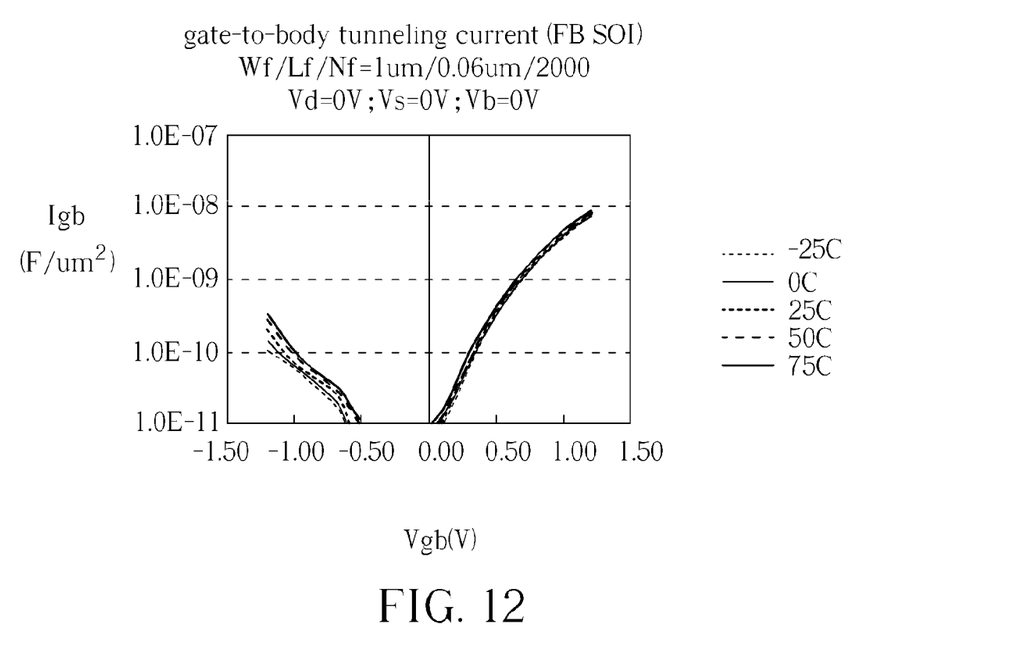
FIG. 12 is an $I_{gb}$-$V_{gb}$ curve diagram of a P-type FB SOI device obtained by the present invention.

Please refer to FIGS. 9-12, FIG. 9 is an tunneling current-to-gate voltage ($I_{gb}$-$V_{gb}$) curve diagram of an N-type BT SOI device, FIG. 10 is an $I_{gb}$-$V_{gb}$ curve diagram of an N-type FB SOI device obtained by the present invention, FIG. 11 is an $I_{gb}$-$V_{gb}$ curve diagram of a P-type BT SOI device, and FIG. 12 is an $I_{gb}$-$V_{gb}$ curve diagram of a P-type FB SOI device obtained by the present invention. According to the provided curve diagrams, it is found that no matter the BT SOI device is N-type or P-type, the $I_{gb}$ of the BT SOI device is different from the real $I_{gb}$ of the FB SOI device. Accordingly, by providing the $I_{gb}$ of the dummy device 300, the $I_{gb}$ of the BT SOI device 200 is calibrated, and thus the real $I_{gb}$ of the FB SOI device is obtained.

Figure 13:
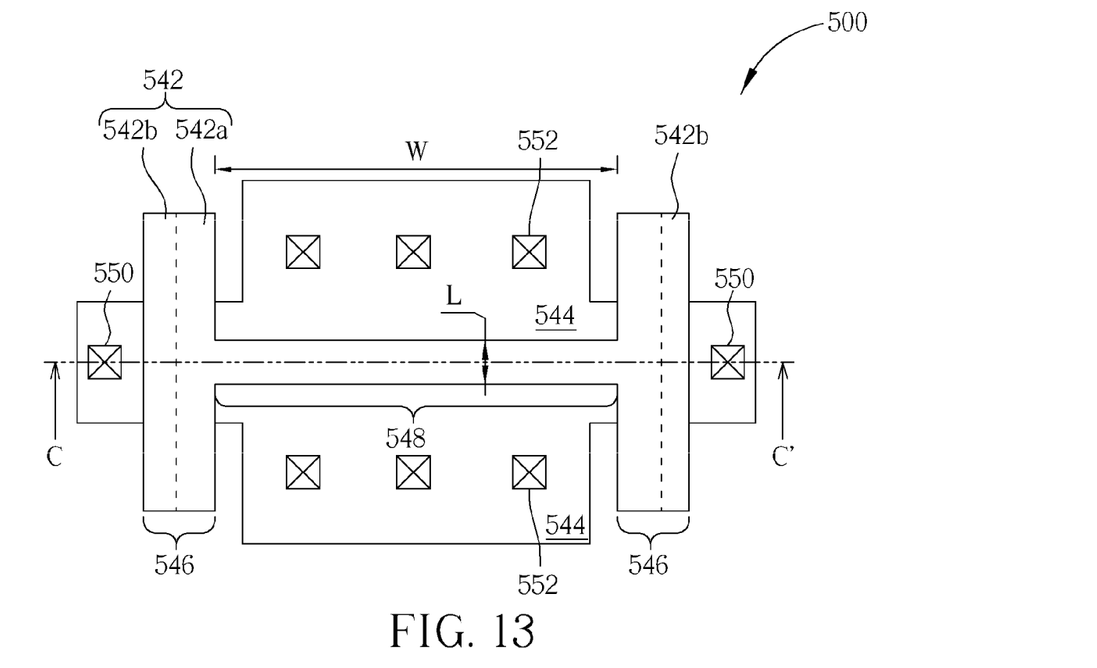
FIG. 13 is a schematic diagram of a BT SOI device provided by a second preferred embodiment.
Figure 14:
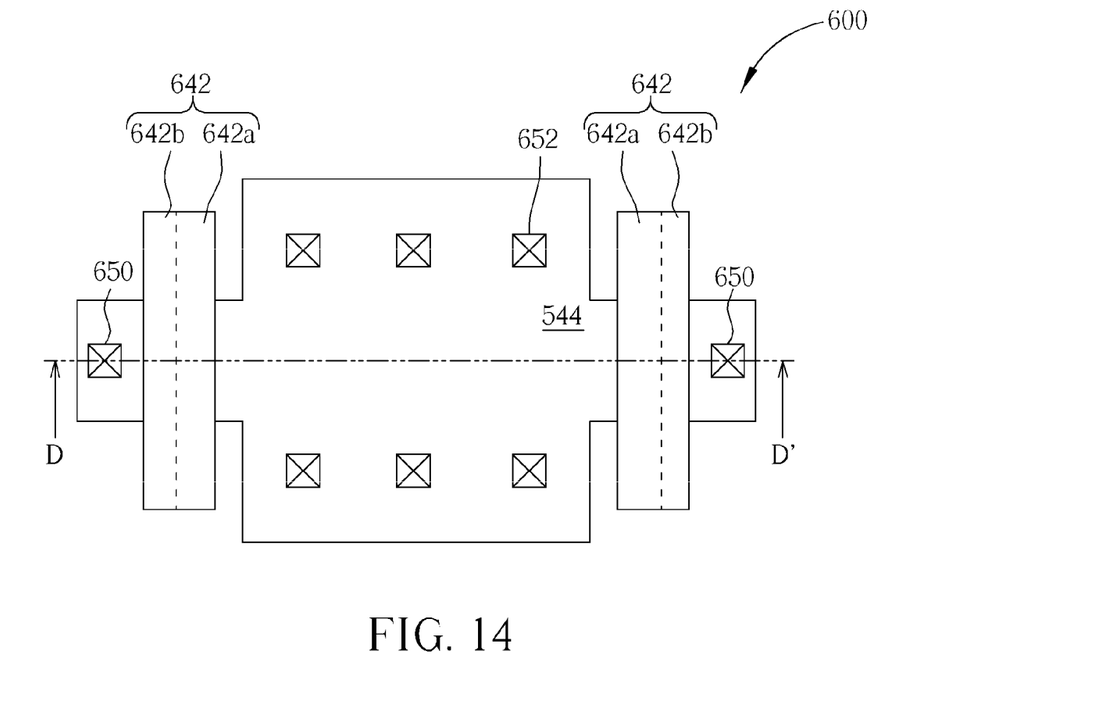
FIG. 14 is a schematic diagram of a BT dummy device provided by the second preferred embodiment.

Please refer to FIG. 13 and FIG. 14, FIG. 13 is a schematic diagram of a BT SOI device provided by a second preferred embodiment; FIG. 14 is a schematic diagram of a BT dummy device 600 provided by the second preferred embodiment. Because a linear body resistance ($R_B$) is given by functional relationship of width of the device (W) and length of the gate (L), H-shaped gate structure is developed to reduce the $R_B$, thus to avoid cut-off caused by larger $R_B$. RF Device comprising H-shaped gate structure has larger cutoff frequency, smaller minimum noise figure and enhanced RF performance than that comprising the T-shaped gate structure because the H-shaped gate structure possesses lower $R_B$ and better transconductance. When the FB SOI device adopting the H-shaped gate structure is formed, a BT SOI device 500 is formed in the scribe line of the device wafer or on the surface of a monitor wafer by the same processes used to fabricate the FB SOI device adopting the H-shaped gate structure. Thus the BT SOI device 500 provided by the second preferred embodiment has an H-shaped gate as shown in FIG. 13. Furthermore, the BT SOI device 500 and the BT dummy device 600 provided by the second preferred embodiment is an N-type MOSFET device, but those skilled in the art would easily realize that those devices are not limited to be P-type devices. When the BT SOI device 500 is provided as a P-type BT SOI device, it is well-known that the adoptions of N- or P-type dopants are to be contrary to the following description. Additionally, since materials used in the second preferred embodiment are similar with those used in the first preferred embodiment, those details are also omitted for brevity.

As shown in FIG. 13. The BT SOI device 500 positioned on a SOI substrate 510 comprises an H-shaped gate structure 542. The gate structure 542 includes a pair of first parts 546, which are parallel to each, and a second part 548 perpendicular to the first parts 546. The second part 548 is formed across a P-well (not shown). At two sides of the second part 548, an N-type source/drain heavily doped region 544 is formed in the P-well. The BT SOI device 500 also comprises a P-type heavily doped region, which is isolated from the N-type source/drain heavily doped region 544 by the P-well. As mentioned above, since the gate structure 542 servers as an ion implantation mask, an N-type region 542a as shown in FIG. 13 is formed in the second part 548 and a portion of the first part 546. Furthermore, p-type regions 542b are formed in portions of the first part 546 that is distal to the N-type source/drain heavily doped region 544. Accordingly, the gate structure 542 is divided into a pair of first parts 546 that are parallel to each and a second part 548 that is perpendicular to the first parts 546 and crosses the P-well 530 according to its structural feature; the gate structure 542 is also divided into the N-type region 542a and the P-type region 542b according to dopant types. In addition, the P-type ion implantation mentioned above is performed to form a P-type heavily doped region 532 in the P-type doped silicon layer 516. The BT SOI device 500 further comprises contact plugs 550 and 552

(shown in FIG. 13): the contact plugs 550 are electrically connected to the body under the gate structure 542 and the contact plugs 552 are electrically connected to the source/drain heavily doped region 544. Accordingly, device characteristics of the BT SOI device 500, such as the $C_{gb}$ and $I_{gb}$ are measured and extracted.

Please refer to FIG. 14. As mentioned above, because the first part 546 of the H-shaped gate structure 542 comprises the N-type region 242a and the P-type region 242b, the obtained $C_{gb}$ and $I_{gb}$ of the second part 548 are distorted. Accordingly, the BT dummy device 600 is provided. The BT dummy device 600 is formed on the SOI substrate 510 as the BT SOI device 500. What different from the BT SOI device 500 is that the BT dummy device 600 does not include the second part 548 that across the P-well and possesses the practical function. However, the BT dummy device 600 still comprises the N-type source/drain heavily doped region 544 and the P-type heavily doped region while the P-type heavily doped region is isolated from the N-type source/drain heavily doped region 544 by the P-well. The dummy gate 632 comprises an N-type region 642a proximal to the N-type source/drain heavily doped region 544 and a P-type region 642b proximal to the P-type heavily doped region. However, the dummy gate 642 of the BT dummy device 600 is not across the N-type source/drain heavily doped region 544. Accordingly, the dummy gate 642 of the BT dummy device 600 is identical to the first part 546 of the gate structure 542 of the BT SOI device 500. Additionally, the BT dummy device 600 also comprises contact plugs 650 and 652: the contact plugs 650 are electrically connected to the body and the contact plugs 652 are electrical connected to the N-type source/drain heavily doped region 544. Therefore BT dummy device 600 is able to provide characteristics of the dummy gate 642 to the body.

Please refer to FIG. 6 again, since the method of measuring a semiconductor device provided by the second preferred embodiment is the same with that provided by the first preferred embodiment, steps and details are omitted herein.

Figure 15:
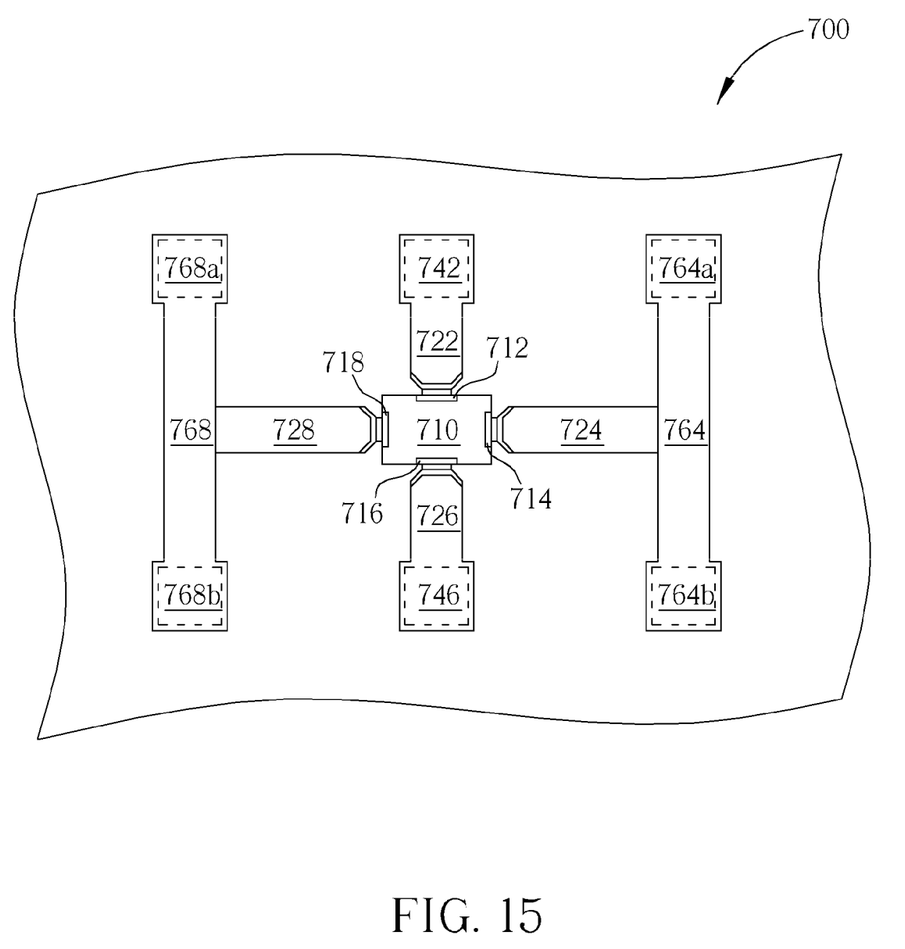
FIG. 15 is a schematic diagram of a RF test key provided by the present invention.

It is more noteworthy that since the $I_{gb}$ and the $C_{gb}$ are very minute, the BT SOI device 200/500 and the dummy device 300/600 provided by the present invention are preferably constructed in a RF test key for improving accuracy of the results of measurement. Please refer to FIG. 17, which is a schematic diagram of a RF test key provided by the present invention. As shown in FIG. 17, the RF test key 700 is positioned on the substrate 210/510. A device under test (DUT) 710 such as the BT SOI device 200/500 or the BT dummy device 300/600 is located in the center of the RF test key 700. The DUT 710 includes a gate connecting terminal 712, a source connecting terminal 714, a drain connecting terminal 716 and a body connecting terminal 178. Said connecting terminals are electrically connected to the gate, the source, the drain, and the body of the DUT 710, respectively. The RF test key 700 comprises a bottom metal layer and a top metal layer. The bottom metal layer includes a front portion 722, a right portion 724, a rear portion 726 and a left portion 728. Said portions are positioned surrounding the DUT 710 and electrically connected to the gate connecting terminal 712, the source connecting terminal 714, the drain connecting terminal 716 and the body connecting terminal 718, respectively. And a front signal pad 742 and a rear signal pad 746 are respectively defined in the front portion 722 and the rear portion 726 for electrically connecting to the probes.

The top metal layer of the RF test key 700 is positioned on the bottom metal layer, and a dielectric layer (not shown) is sandwiched between the top metal layer and the bottom metal layer. The top metal layer includes a right piece 764 and a left piece 768 that are electrically connected to the right portion 724 and the left portion 728 of the bottom metal layer by via plugs, respectively. The right piece 764 and the left piece 768 are narrow metal pieces positioned parallel to each other. A ground pad 764a and a ground pad 764b are respectively defined in the front of the right piece 764 and in the rear of the right piece 764, and a ground pad 768a and a ground pad 768b are respectively defined in the front of the left piece 768 and in the rear of the left piece 768. As shown in FIG. 17, the ground pad 768a, the front signal pad 742 and the ground pad 764a are arranged in a front row region, and the ground pad 768b, the rear signal pad 746 and the ground pad 764b are arranged in a rear row region. As a result, the ground pads and the signal pad in the front and rear row regions are arranged as: the ground pad 768a/768b, the signal pad 742/746, and the ground pad 764a/764b (G-S-G) from left to right. Accordingly, probes of a probe card is to contact the front row region and the rear row region of the RF test key 700 to test the DUT 710.

In view of the foregoing description, the method of measuring semiconductor device provided by the present invention provides the dummy device positioned in company with the de-embedding technology introduced for the first time to filter the parasitic effect of the BT SOI device out, therefore accurate $C_{gb}$ of the FB SOI device can be obtained by analyzing the S-parameter. Furthermore, the $I_{gb}$ of the dummy device is provided to calibrate the $I_{gb}$ of the BT SOI device, thus a real $I_{gb}$ of the FB SOI device is obtained.

Those skilled in the art will readily observe that numerous modifications and alterations of the device and method may be made while retaining the teachings of the invention.

What is claimed is:

1. A method of measuring a semiconductor device comprising steps of:
   providing a silicon-on-insulator (SOI) substrate with at least a body-tied (BT) SOI device and a body-tied (BT) dummy device for measurement, where in the BT dummy device comprises a first conductive type source/drain heavily doped region and a dummy gate, and the dummy is not positioned on the first conductive type source/drain heavily doped region;
   measuring scattering parameters (S-parameters) and tunneling currents ($I_{gb}$) of the BT SOI device and the BT dummy device, respectively;
   subtracting $I_{gb}$ of the BT dummy device from that of the BT SOI device to obtain $I_{gb}$ of a floating body (FB) SOI device;
   filtering characteristics of the BT dummy device out to extract S-parameters of the FB SOI device; and
   analyzing the S-parameters of the FB SOI device to obtain gate-related capacitances ($C_{gb}$) of the FB SOI device.

2. The method of claim 1, wherein the BT SOI device and the BT dummy device are simultaneously formed on the SOI substrate by same processes.

3. The method of claim 1, wherein the SOI substrate comprises a plurality of second conductive type well.

4. The method of claim 3, wherein the BT SOI device comprises:
   a gate structure formed on the second conductive type well;
   at least a first conductive type source/drain heavily doped region formed in the second conductive type well;
   a second conductive type heavily doped region formed in the SOI substrate, the second conductive type heavily doped region being isolated from the first conductive type source/drain heavily doped region by the second conductive type well; and
   a body electrically connected to a circuit.

5. The method of claim 4, wherein the gate structure comprises a first part and a second part perpendicular to the first part, and the second part is formed across the second conductive type well.

6. The method of claim 5, wherein the first part of the gate structure comprises a first conductive type region and a second conductive type region, the first conductive type region is proximal to the first conductive type source/drain heavily doped region and the second conductive type region is adjacent to the second conductive type heavily doped region.

7. The method of claim 6, wherein the gate structure is a T-shaped gate structure.

8. The method of claim 7, wherein the BT dummy device comprises:
a second conductive type heavily doped region; and
a body electrically connected to a circuit; wherein
the dummy gate is positioned on the second conductive type well and comprises a first conductive type region and a second conductive type region, the first conductive type region is proximal to the first conductive type source/drain heavily doped region and the second conductive type region is proximal to the second conductive type heavily doped region.

9. The method of claim 6, wherein the gate structure is a H-shaped gate structure, and the first parts of the H-shaped gate structure are positioned parallel to each other and on opposite ends of the second part.

10. The method of claim 9, wherein the BT dummy device comprise:
a second conductive type heavily doped region; and
a body electrically connected to a circuit; wherein
the dummy gates is a pair of dummy gates positioned parallel to each on the second conductive type well and respectively comprises a first conductive type region and a second conductive type region, the first conductive type region is proximal to the first conductive type source/drain heavily doped region and the second conductive type region is proximal to the second conductive type heavily doped region.

11. The method of claim 1, wherein the BT SOI device and the BT dummy device are constructed in a radio frequency (RF) test key.

12. The method of claim 1, wherein the SOI substrate is a device wafer or a monitor wafer.

13. A semiconductor device comprising:
a SOI substrate having a second conductive type well;
a first conductive type source/drain heavily doped region formed in the second conductive type well;
a second conductive type heavily doped region formed in the SOI substrate, the second conductive type heavily doped region being isolated from the first conductive type source/drain heavily doped region by the second conductive type well;
a dummy gate positioned on the first conductive type well, the dummy gate being not across the first conductive type source/drain heavily doped region; and
a body-tied (BT) body electrically connected to a circuit.

14. The semiconductor device of claim 13, wherein the SOI substrate sequentially comprises a substrate, a buried oxide (BOX) layer and a first conductive type doped silicon layer.

15. The semiconductor device of claim 13, wherein the dummy gate comprises a first conductive type region and a second conductive type region, the first conductive type region is proximal to the first conductive type source/drain heavily doped region and the second conductive type region is proximal to the second conductive type heavily doped region.

16. The semiconductor device of claim 13, wherein the dummy gate comprises a pair of structures parallel to each other.

17. The semiconductor device of claim 13, wherein the semiconductor device is constructed in a RF test key.

18. The semiconductor device of claim 13, wherein the SOI substrate is a device wafer.

19. The semiconductor device of claim 18, wherein the semiconductor device is formed in scribe lines of the device wafer.

20. The semiconductor device of claim 13, wherein the SOI substrate is a monitor wafer.

* * * * *

UNITED STATES PATENT AND TRADEMARK OFFICE
CERTIFICATE OF CORRECTION

PATENT NO.         : 8,093,916 B2
APPLICATION NO.    : 12/478776
DATED              : January 10, 2012
INVENTOR(S)        : Yue-Shiun Lee et al.

It is certified that error appears in the above-identified patent and that said Letters Patent is hereby corrected as shown below:

On the title page, item (73), correct the name of the assignee from "United Microelectronics Corp," to --United Microelectronics Corp.--.

Signed and Sealed this
Twenty-seventh Day of March, 2012

David J. Kappos
*Director of the United States Patent and Trademark Office*